(12) United States Patent
Huang

(10) Patent No.: US 8,450,987 B2
(45) Date of Patent: May 28, 2013

(54) SWITCHING APPARATUS AND CONTROL SIGNAL GENERATOR THEREOF

(75) Inventor: Ju-Lin Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 470 days.

(21) Appl. No.: 12/776,430

(22) Filed: May 10, 2010

(65) Prior Publication Data

US 2011/0062924 A1 Mar. 17, 2011

(30) Foreign Application Priority Data

Sep. 11, 2009 (TW) .............................. 98130805 A

(51) Int. Cl.
*G05F 1/40* (2006.01)
(52) U.S. Cl.
USPC ........................................................ 323/282
(58) Field of Classification Search
USPC .................. 323/265, 273, 282, 351; 327/170, 327/172, 218
See application file for complete search history.

(56) References Cited

U.S. PATENT DOCUMENTS

| | | | | |
|---|---|---|---|---|
| 2007/0262791 | A1* | 11/2007 | Pfefferl | 326/86 |
| 2009/0184744 | A1* | 7/2009 | Ricotti et al. | 327/218 |
| 2009/0219746 | A1* | 9/2009 | Bosmuller et al. | 365/72 |
| 2010/0171538 | A1* | 7/2010 | Chang et al. | 327/170 |
| 2011/0216573 | A1* | 9/2011 | Abe et al. | 365/148 |

FOREIGN PATENT DOCUMENTS

| | | |
|---|---|---|
| CN | 101409550 | 4/2009 |
| TW | 200803168 | 1/2008 |

OTHER PUBLICATIONS

"1st Office Action of China Counterpart Application", issued on Apr. 5, 2012, p. 1-p. 6, in which the listed reference was cited.
Matano et al., "A 1Gb/s/pin 512-MB DDRII SDRAM Using a Digital DLL and a Slew-Rate-Controlled Output Buffer" IEEE Journal of Solid-State Cricuits, vol. 38, No. 5, pp. 762-768, Issued on May 2003.
"Office Action of Taiwan Counterpart Application", issued on Aug. 24, 2012, p. 1-p. 6, in which the listed references were cited.

* cited by examiner

*Primary Examiner* — Adolf Berhane
(74) *Attorney, Agent, or Firm* — Jianq Chyun IP Office

(57) ABSTRACT

A switching apparatus has a switch and a control signal generator. The control signal generator is configured to generate a control signal applied to the switch to control the operations of turning on and off of the switch. The control signal generator has an inverter and a regulating circuit. The input end of the inverter receives an input signal, and the output end of the inverter outputs the control signal. The regulating circuit has a switching unit and a capacitor. A first end of the switching unit is coupled to the output end of the inverter, a second end of the switching unit is coupled to a first system voltage, a third end of the switching unit is coupled to a first end of the capacitor, and a second end of the capacitor is coupled to a second system voltage.

20 Claims, 3 Drawing Sheets

SWITCHING APPARATUS AND CONTROL SIGNAL GENERATOR THEREOF

CROSS-REFERENCE TO RELATED APPLICATION

This application claims the priority benefit of Taiwan application serial no. 98130805, filed on Sep. 11, 2009. The entirety of the above-mentioned patent application is hereby incorporated by reference herein and made a part of specification.

BACKGROUND OF THE INVENTION

1. Field of the Invention

The invention generally relates to a switching apparatus and a control signal generator thereof, and more particularly, to a switching apparatus and a control signal generator thereof capable of generating a control voltage having a plurality of segmented waveforms.

2. Description of Related Art

In the conventional art, a switch may be controlled by a control signal. When the status of the switch is quickly switched, charges at the two sides of the switch is quickly neutralized, so that signals at the two sides of the switch is quickly balanced or reach a predetermined voltage level. However, in some applications of circuits, an unexpected result may occur due to the quick balance of the signals. For example, power drop may be occurred due to a high instantaneous current. In order to solve the issues result from the above unexpected result, the duration for switching the voltage level of the control signal is usually extended to avoid the signals at the two sides of the switch being quickly balanced. However, this solution may result that the response time of the signals at the two sides of the switch is too long.

FIG. 1 is a schematic view of the operation in which a switch is controlled by using a control signal in the conventional art. Referring to FIG. 1, the switch 10 is located between a first end A and a second end B to connect or disconnect the first end A and the second end B. Generally, when the control signal OPC is at a low voltage level, the switch 10 is turned off, so that the first end A and the second end B are disconnected; when the control signal OPC is at a high voltage level, the switch 10 is turned on, so that the first end A and the second end B are connected. Moreover, for another kind of switch 10, when the control signal OPC is at the low voltage level, the switch 10 is turned on; when the control signal OPC is at the high voltage level, the switch 10 is turned off.

Please refer to FIG. 1 and FIG. 2. FIG. 2 is a timing diagram of a control signal OPC in FIG. 1. In such a case, it may result the issue that causes power drop because the switch time of the voltage level of the control signal OPC is too short.

Please refer to FIG. 1 and FIG. 3. FIG. 3 is another timing diagram of a control signal OPC in FIG. 1. In such a case, it may result the issue that causes a long response time of the signals at the two sides of the switch because the duration for switching the voltage level of the control signal OPC is too long.

SUMMARY OF THE INVENTION

An embodiment of the invention provides a control signal generator. The control signal generator is configured to generate a suitable control signal to achieve a balance between preventions of overly slow response of switches and power drop due to a high instantaneous current.

An embodiment of the invention provides a switching apparatus having a switch and a control signal generator. The above-described control signal generator is configured to generate a suitable control signal to achieve a balance between preventions of overly slow response of switches and power drop due to a high instantaneous current.

An embodiment of the invention provides a control signal generator. The control signal generator is adapted to generate a control signal to control a switch to be turned on or off, the control signal generator. The above-described control signal generator includes an inverter and a regulating circuit. An input end of the inverter receives an input voltage, and an output end of the inverter outputs the control signal. The regulating circuit includes a switch unit and a capacitor. Wherein, a first end of the switch unit is coupled to the output end of the inverter, a second end of the switch unit is coupled to a first system voltage, a third end of the switch unit is coupled to a first end of the capacitor, and a second end of the capacitor is coupled to a second system voltage.

An embodiment of the invention provides a switching apparatus. The above-described switching apparatus includes a switch and a control signal generator. The above-described control signal generator is adapted to generate a control signal to control the switch to be turned on or off. The above-described control signal generator includes an inverter and a regulating circuit. An input end of the inverter receives an input voltage, and an output end of the inverter outputs the control signal. The above-described regulating circuit includes a switch unit and a capacitor. Wherein, a first end of the switch unit is coupled to the output end of the inverter, a second end of the switch unit is coupled to a first system voltage, a third end of the switch unit is coupled to a first end of the capacitor, and a second end of the capacitor is coupled to a second system voltage.

In an embodiment of the invention, the first system voltage is greater than the second system voltage.

In an embodiment of the invention, the above-described inverter includes a first transistor and a second transistor. A first end of the first transistor is coupled to the first system voltage, a second end of the first transistor is coupled to the input voltage, and a third end of the first transistor outputs the control signal. A first end of the second transistor is coupled to the third end of the first transistor and outputs the control signal, a second end of the second transistor receives the input voltage and is coupled to the second end of the first transistor, and a third end of the second transistor is coupled to the second system voltage.

In an embodiment of the invention, the above-described control signal generator further includes a current source. The above-described current source is coupled between the first end of the first transistor and the first system voltage and configured to provide an input current to the inverter.

In an embodiment of the invention, the first system voltage is less than the second system voltage.

In an embodiment of the invention, the above-described inverter includes a first transistor and a second transistor. A first end of the first transistor is coupled to the second system voltage, a second end of the first transistor is coupled to the input voltage, and a third end of the first transistor outputs the control signal. A first end of the second transistor is coupled to the third end of the first transistor and outputs the control signal, a second end of the second transistor receives the input voltage and is coupled to the second end of the first transistor, and a third end of the second transistor is coupled to the first system voltage.

In an embodiment of the invention, the above-described control signal generator further includes a current source. The above-described current source is coupled between the third end of the second transistor and the second system voltage and configured to provide an input current to the inverter.

In an embodiment of the invention, the above-described control signal generator further includes a current source. The above-described current source is coupled to the inverter and configured to provide an input current to the inverter.

In an embodiment of the invention, the above-described switch unit is an n-type metal oxide semiconductor field effect transistor (NMOSFET).

In an embodiment of the invention, the above-described switch unit is a p-type metal oxide semiconductor field effect transistor (PMOSFET).

In view of the above, the switch unit of the regulating circuit is controlled by charging the capacitor of the regulating circuit in the embodiment of the invention. Wherein, when the switch unit of the regulating circuit is turned on, the capacitor of the regulating circuit is charged, so that the voltage level of the control signal outputted by control signal generator changes more slowly; when the switch unit of the regulating circuit is turned off, the capacitor of the regulating circuit stops being charged, so that the voltage level of the control signal outputted by control signal generator changes more quickly. Accordingly, the balance between preventions of overly slow response of switches and power drop due to a high instantaneous current is achieved.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
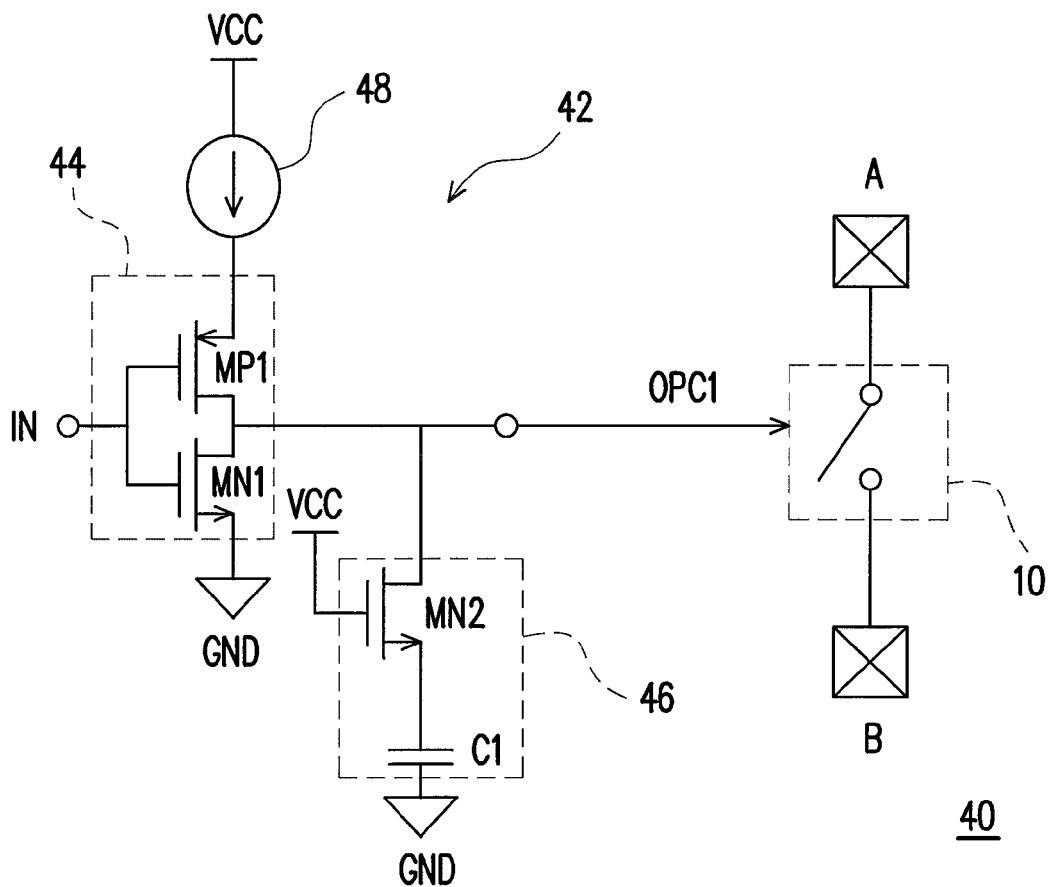
FIG. 4 is a circuit diagram of a switching apparatus according to an embodiment of the present invention.
Figure 5:
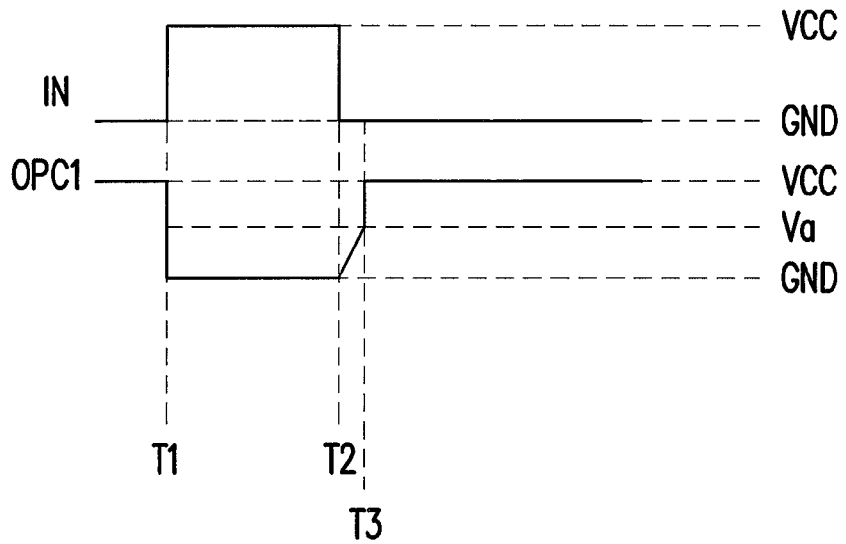
FIG. 5 is a timing diagram of an input voltage IN and a control signal OPC1 in FIG. 4.

Please refer to FIG. 4 and FIG. 5. FIG. 4 is a circuit diagram of a switching apparatus 40 according to an embodiment of the present invention. FIG. 5 is a timing diagram of an input voltage IN and a control signal OPC1 in FIG. 4. The switching apparatus 40 includes a switch 10 and a control signal generator 42. The switch 10 is positioned between a first end A and a second end B to connect or disconnect the first end A and the second end B. Generally, when the control signal OPC1 is at a low voltage level, the switch 10 is turned off, so that the first end A and the second end B are disconnected; when the control signal OPC1 is at a high voltage level, the switch 10 is turned on, so that the first end A and the second end B are connected. Moreover, for another kind of switch 10, when the control signal OPC1 is at the low voltage level, the switch 10 is turned on; when the control signal OPC1 is at the high voltage level, the switch 10 is turned off.

The control signal generator 42 is coupled to the switch 10 and adapted to generate the control signal OPC1 to control the switch 10 to be turned on or off. The control signal generator 42 includes an inverter 44 and a regulating circuit 46. An input end of the inverter 44 receives the input voltage IN, and an output end of the inverter 44 outputs the control signal OPC1. The regulating circuit 46 includes a switch unit MN2 and a capacitor C1. Wherein, a first end of the switch unit MN2 is coupled to the output end of the inverter 44, a second end of the switch unit MN2 is coupled to a system voltage VCC, a third end of the switch unit MN2 is coupled to a first end of the capacitor C1, and a second end of the capacitor C1 is coupled to a system voltage GND. In the present embodiment, the system voltage VCC serves as a first system voltage, and the system voltage GND serves as a second system voltage. Moreover, the switch unit MN2 is an n-type metal oxide semiconductor field effect transistor (NMOSFET), and a first end, a second end, and a third end of the switch unit MN2 are respectively the drain, the gate, and the source of the NMOSFET. Furthermore, the first system voltage VCC is a positive voltage, and the second system voltage GND is a ground voltage. However, the invention is not limited thereto. For example, the switch unit MN2 may be a bipolar junction transistor (BJT), and the first system voltage VCC is simply greater than the second system voltage GND.

In the present embodiment, the control signal generator 42 further includes a current source 48. The current source 48 is coupled to the inverter 44 and configured to provide an input current to the inverter 44. It should be noted that, the current source 48 is used for enhance the efficiency for charging the capacitor C1. Accordingly, for the invention, the current source 48 is optional. In other words, in an embodiment of the invention, the inverter 44 may be directly coupled to the first system voltage VCC.

The inverter 44 includes a first transistor MP1 and a second transistor MN1. A first end of the first transistor MP1 is coupled to the first system voltage VCC, a second end of the first transistor MP1 receives the input voltage IN, and a third end of the first transistor MP1 outputs the control signal OPC1. A first end of the second transistor MN1 is coupled to the third end of the first transistor MP1 and outputs the control signal OPC1, a second end of the second transistor MN1 receives the input voltage IN and is coupled to the second end of the first transistor MP1, and a third end of the second transistor MN1 is coupled to the second system voltage GND. In the present embodiment, the first transistor MP1 is a p-type metal oxide semiconductor field effect transistor (PMOSFET), and a first end, a second end, and a third end of the first transistor MP1 are respectively the drain, the gate, and the source of the PMOSFET; the second transistor MN1 is an n-type metal oxide semiconductor field effect transistor (NMOSFET), and a first end, a second end, and a third end of the second transistor MN1 are respectively the drain, the gate, and the source of the NMOSFET.

At the time T1, the voltage level of the input voltage IN is switched from the low voltage level to the high voltage level. Accordingly, the second transistor MN1 is turned on, and the first transistor MP1 is turned off, so that the voltage level of the control signal OPC1 falls from the first system voltage VCC to the second system voltage GND.

At the time T2, the voltage level of the input voltage IN is switched from the high voltage level to the low voltage level.

Accordingly, the first transistor MP1 is turned on, and the second transistor MN1 is turned off. At this time, because the gate of the switch unit MN2 is coupled the first system voltage VCC, the switch unit MN2 is turned on. Accordingly, the capacitor C1 is charged because the two ends thereof are respectively electrically connected to the first system voltage VCC and the second system voltage GND, such that the voltage level of the end of the capacitor C1 coupled to the switch unit MN2 is raised. As a result, during the period between the time T2 to the time T3, the voltage level of the control signal OPC1 and the voltage level of the end of the capacitor C1 coupled to the switch unit MN2 are gradually raised.

When the voltage level of the control signal OPC1 is raised to a voltage level Va at the time T3, the voltage difference between the gate and the source of the switch unit MN2 is less than the threshold voltage of the switch unit MN2, so that the switch unit MN2 is turned on. Accordingly, after the time T3, the electrical connection between the capacitor C1 and the first system voltage VCC are is cut off, so that the voltage level of the control signal OPC1 is quickly raised from the voltage level Va to the first system voltage VCC after the time T3.

Figure 1:
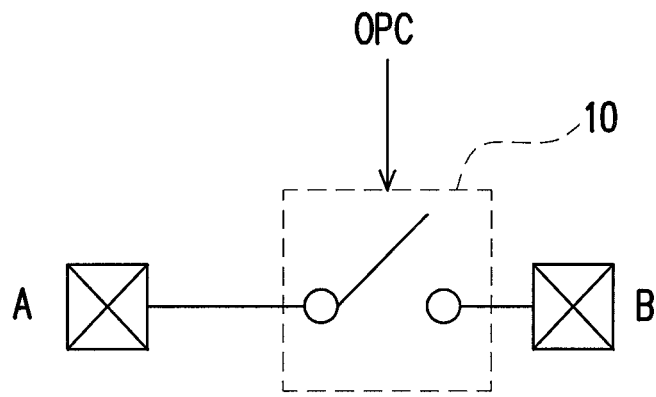
FIG. 1 is a schematic view of the operation in which a switch is controlled by using a control signal in the conventional art.
Figure 2:
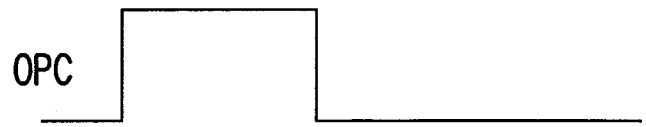
FIG. 2 is a timing diagram of a control signal OPC in FIG. 1.
Figure 3:
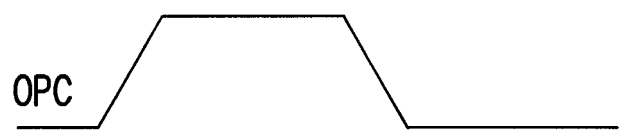
FIG. 3 is another timing diagram of the control signal OPC in FIG. 1.

Because the duration when the voltage level of the control signal OPC1 is raised from the second system voltage GND to the voltage level Va is extended due to charging of the capacitor C1, the probability of power drop due to the high instantaneous current is reduced. Moreover, because the voltage level of the control signal OPC1 is quickly raised from the voltage level Va to the first system voltage VCC at the time T3, as compared with the switch 10 affected by the control signal OPC in FIG. 3, under control of the control signal OPC1, the two ends of the switch 10 in the present embodiment have a shorter response time for signal transmission. In summary, due to the control signal OPC1, the balance between preventions of overly slow response of switches and power drop resulted from a high instantaneous current is achieved.

Figure 6:
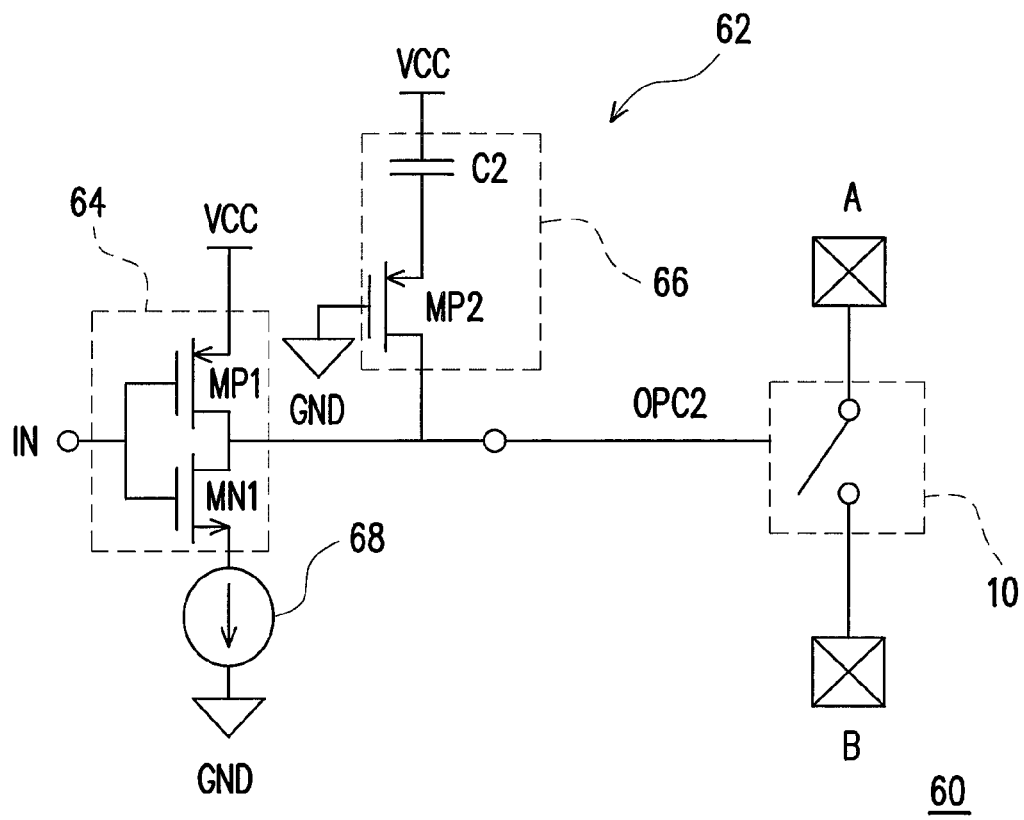
FIG. 6 is a circuit diagram of a switching apparatus according to another embodiment of the present the invention.
Figure 7:
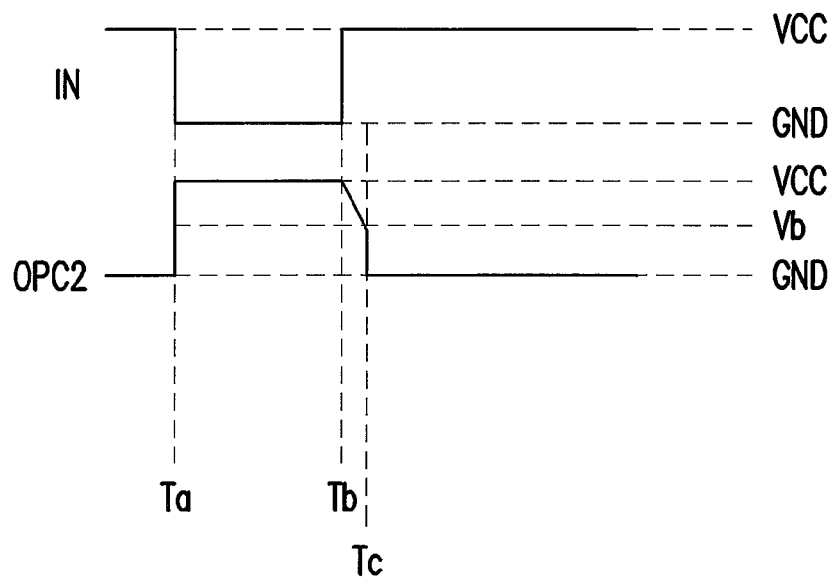
FIG. 7 is a timing diagram of an input voltage IN and a control signal OPC2 in FIG. 6.

Please refer to FIG. 6 and FIG. 7. FIG. 6 is a circuit diagram of a switching apparatus 60 according to another embodiment of the present invention. FIG. 7 is a timing diagram of an input voltage IN and a control signal OPC2 in FIG. 6. The switching apparatus 60 includes a switch 10 and a control signal generator 62. The function and the operation of the switch 10 can be known according to the above description, and it will not be repeated herein.

The control signal generator 62 is coupled to the switch 10 and configured to generate the control signal OPC2 to control the switch 10 to be turned on or off. The control signal generator 62 includes an inverter 64 and a regulating circuit 66. An input end of the inverter 64 receives the input voltage IN, and an output end of the inverter 64 outputs the control signal OPC2.

The regulating circuit 66 includes a switch unit MP2 and a capacitor C2. Wherein, a first end of the switch unit MP2 is coupled to the output end of the inverter 44, a second end of the switch unit MP2 is coupled to the system voltage GND, a third end of the switch unit MP2 is coupled to a first end of the capacitor C2, and a second end of the capacitor C2 is coupled to the system voltage VCC. The difference of the present embodiment from the previous embodiment is that, the system voltage GND serves as the first system voltage, and the system voltage VCC serves as the second system voltage in the present embodiment. Moreover, the switch unit MP2 is a PMOSFET, and a first end, a second end, and a third end of the switch unit MP2 are respectively the drain, the gate, and the source of the PMOSFET. Furthermore, the first system voltage GND is the ground voltage, and the second system voltage VCC is the positive voltage. However, the invention is not limited thereto. For example, the switch unit MP2 may be a BJT, and the first system voltage GND is simply less than the second system voltage VCC.

In the present embodiment, the control signal generator 62 further includes a current source 68. The current source 68 is coupled to the inverter 64 and configured to generate a current. It should be noted that, the current source 68 is used for enhance the efficiency of charging the capacitor C2. Accordingly, for the invention, the current source 68 is optional. In other words, in an embodiment of the invention, the inverter 64 may be directly coupled to the first system voltage GND.

The inverter 64 includes a first transistor MP1 and a second transistor MN1. A first end of the first transistor MP1 is coupled to the system voltage VCC, a second end of the first transistor MP1 receives the input voltage IN, and a third end of the first transistor MP1 outputs the control signal OPC2. A first end of the second transistor MN1 is coupled to the third end of the first transistor MP1 and outputs the control signal OPC2, a second end of the second transistor MN1 receives the input voltage IN and is coupled to the second end of the first transistor MP1, and a third end of the second transistor MN1 is coupled to the system voltage GND. In the present embodiment, the first transistor MP1 is a PMOSFET, and a first end, a second end, and a third end of the first transistor MP1 are respectively the drain, the gate, and the source of the PMOSFET; the second transistor MN1 is an NMOSFET, and a first end, a second end, and a third end of the second transistor MN1 are respectively the drain, the gate, and the source of the NMOSFET.

At the time Ta, the voltage level of the input voltage IN is switched from the high voltage level to the low voltage level. Accordingly, the first transistor MP1 is turned on, and the second transistor MN1 is turned off, so that the voltage level of the control signal OPC2 is raised from the system voltage GND to the system voltage VCC.

At the time Tb, the voltage level of the input voltage IN is switched from the low voltage level to the high voltage level. Accordingly, the second transistor MN1 is turned on, and the first transistor MP1 is turned off. At this time, because the gate of the switch unit MP2 is coupled the system voltage GND, the switch unit MN2 is turned on. Accordingly, the capacitor C2 is charged because the two ends thereof are respectively electrically connected to the system voltage VCC and the system voltage GND, such that the voltage level of the end of the capacitor C2 coupled to the switch unit MP2 is raised. As a result, during the period between the time Ta to the time Tc, the voltage level of the control signal OPC2 and the voltage level of the end of the capacitor C2 coupled to the switch unit MN2 fall gradually.

When the voltage level of the control signal OPC2 falls to a voltage level Vb at the time Tc, the voltage difference between the gate and the source of the switch unit MP2 is less than the threshold voltage of the switch unit MP2, so that the switch unit MP2 is turned off. Accordingly, after the time Tc, the electrical connection between the capacitor C2 and the system voltage GND are is cut off, so that the voltage level of the control signal OPC2 quickly falls from the voltage level Vc to the first system voltage GND after the time Tc.

Because the duration when the voltage level of the control signal OPC2 falls from the system voltage VCC to the voltage level Vb is extended due to discharging the capacitor C2, the probability of power drop due to the high instantaneous current is reduced. Moreover, because the voltage level of the control signal OPC2 quickly falls from the voltage level Vb to the system voltage GND at the time Tc, the two ends of the switch 10 have a shorter response time for signal transmission at the time Tc.

To sum up, in the embodiments of the invention, the switch unit of the regulating circuit is controlled by charging the capacitor of the regulating circuit. Herein, when the switch unit of the regulating circuit is turned on, the capacitor of the regulating circuit is charged/discharged, so that the voltage level of the control signal outputted by control signal generator changes more slowly; when the switch unit of the regulating circuit is turned off, the capacitor of the regulating circuit stops being charged/discharged, so that the voltage level of the control signal outputted by control signal generator changes more quickly. Accordingly, the balance between preventions of overly slow response of switches and power drop due to a high instantaneous current is achieved.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A control signal generator, for generating a control signal to control a switch to be turned on or off, the control signal generator comprising:
    an inverter having an input end receiving an input voltage, an output end outputting the control signal and a first end coupled to a first system voltage; and
    a regulating circuit comprising a switch unit and a capacitor, wherein a first end of the switch unit is coupled to the output end of the inverter, a second end of the switch unit is coupled to the first system voltage, a third end of the switch unit is coupled to a first end of the capacitor, and a second end of the capacitor is coupled to a second system voltage,
    wherein when the input voltage switches from a first voltage level to a second voltage level, the switch unit is turned on and the first end of the switch unit is conducted with the third end of the switch unit, such that the capacitor is charged or discharged corresponding to the first system voltage coupled to the first end of the inverter,
    when the voltage level of the first end of the capacitor matches a third voltage level, the switch unit is turned off, wherein the third voltage level is between the voltage levels of the first system voltage and the second system voltage.

2. The control signal generator as claimed in claim 1, wherein the first system voltage is greater than the second system voltage.

3. The control signal generator as claimed in claim 2, wherein the inverter comprises:
    a first transistor having a first end coupled to the first system voltage, a second end coupled to the input voltage, and a third end outputting the control signal; and
    a second transistor having a first end coupled to the third end of the first transistor and outputting the control signal, a second end receiving the input voltage and coupled to the second end of the first transistor, and a third end coupled to the second system voltage.

4. The control signal generator as claimed in claim 3, further comprising:
    a current source coupled between the first end of the first transistor and the first system voltage and configured to provide an input current to the inverter.

5. The control signal generator as claimed in claim 1, wherein the first system voltage is less than the second system voltage.

6. The control signal generator as claimed in claim 5, wherein the inverter comprises:
    a first transistor having a first end coupled to the second system voltage, a second end coupled to the input voltage, and a third end outputting the control signal; and
    a second transistor having a first end coupled to the third end of the first transistor and outputting the control signal, a second end receiving the input voltage and coupled to the second end of the first transistor, and a third end coupled to the first system voltage.

7. The control signal generator as claimed in claim 6, further comprising:
    a current source coupled between the third end of the second transistor and the second system voltage and configured to provide an input current to the inverter.

8. The control signal generator as claimed in claim 1, further comprising:
    a current source coupled to the inverter and configured to provide an input current to the inverter.

9. The control signal generator as claimed in claim 1, wherein the switch unit is an n-type metal oxide semiconductor field effect transistor (NMOSFET), and the second end is the gate of the NMOSFET.

10. The control signal generator as claimed in claim 1, wherein the switch unit is a p-type metal oxide semiconductor field effect transistor (PMOSFET), and the second end is the gate of the PMOSFET.

11. A switching apparatus, comprising:
    a switch; and
    a control signal generator, coupled to the switch and adapted to generate a control signal to control the switch to be turned on or off, the control signal generator comprising:
        an inverter having an input end receiving an input voltage an output end outputting the control signal, and a first end coupled to a first system voltage; and
        a regulating circuit comprising a switch unit and a capacitor, wherein a first end of the switch unit is coupled to the output end of the inverter, a second end of the switch unit is coupled to the first system voltage, a third end of the switch unit is coupled to a first end of the capacitor, and a second end of the capacitor is coupled to a second system voltage,
        wherein when the input voltage switches from a first voltage level to a second voltage level, the switch unit is turned on and the first end of the switch unit is conducted with the third end of the switch unit, such that the capacitor is charged or discharged corresponding to the first system voltage coupled to the first end of the inverter,
        when the voltage level of the first end of the capacitor matches a third voltage level, the switch unit is turned off, wherein the third voltage level is between the voltage levels of the first system voltage and the second system voltage.

12. The switching apparatus as claimed in claim 11, wherein the first system voltage is greater than the second system voltage.

13. The switching apparatus as claimed in claim 12, wherein the inverter comprises:
    a first transistor having a first end coupled to the first system voltage, a second end coupled to the input voltage, and a third end outputting the control signal; and a second transistor having a first end coupled to the third end of the first transistor and outputting the control signal, a second end receiving the input voltage and coupled to the second end of the first transistor, and a third end coupled to the second system voltage.

14. The switching apparatus as claimed in claim 13, wherein the control signal generator comprises:
a current source coupled between the first end of the first transistor and the first system voltage and configured to provide an input current to the inverter.

15. The switching apparatus as claimed in claim 11, wherein the first system voltage is less than the second system voltage.

16. The switching apparatus as claimed in claim 15, wherein the inverter comprises:
a first transistor having a first end coupled to the second system voltage, a second end coupled to the input voltage, and a third end outputting the control signal; and
a second transistor having a first end coupled to the third end of the first transistor and outputting the control signal, a second end receiving the input voltage and coupled to the second end of the first transistor, and a third end coupled to the first system voltage.

17. The switching apparatus as claimed in claim 16, wherein the control signal generator comprises:
a current source coupled between the third end of the second transistor and the second system voltage and configured to provide an input current to the inverter.

18. The switching apparatus as claimed in claim 11, wherein the control signal generator comprises:
a current source coupled to the inverter and configured to provide an input current to the inverter.

19. The switching apparatus as claimed in claim 11, wherein the switch unit is an n-type metal oxide semiconductor field effect transistor (NMOSFET), and the second end is the gate of the NMOSFET.

20. The switching apparatus as claimed in claim 11, wherein the switch unit is a p-type metal oxide semiconductor field effect transistor (PMOSFET), and the second end is the gate of the PMOSFET.

* * * * *